(12) United States Patent
Lim et al.

(10) Patent No.: US 12,733,382 B2
(45) Date of Patent: Sep. 8, 2026

(54) LIGHT EMITTING DISPLAY DEVICE

(71) Applicant: LG DISPLAY CO., LTD., Seoul (KR)

(72) Inventors: Young-Nam Lim, Paju-si (KR); Se-Hong Park, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 482 days.

(21) Appl. No.: 18/383,771

(22) Filed: Oct. 25, 2023

(65) Prior Publication Data

US 2024/0224751 A1 Jul. 4, 2024

(30) Foreign Application Priority Data

Dec. 29, 2022 (KR) ........................ 10-2022-0189146

(51) Int. Cl.

| | |
|---|---|
| ***H10K 59/80*** | (2023.01) |
| ***H10K 59/122*** | (2023.01) |
| ***H10K 59/35*** | (2023.01) |

(52) U.S. Cl.

CPC ......... *H10K 59/879* (2023.02); *H10K 59/122* (2023.02); *H10K 59/35* (2023.02); *H10K 59/873* (2023.02); *H10K 59/878* (2023.02)

(58) Field of Classification Search

CPC ........................... H10K 59/879; H10K 59/873

See application file for complete search history.

(56) References Cited

U.S. PATENT DOCUMENTS

2017/0294424 A1* 10/2017 Jeong .................... H10W 90/00
2021/0391513 A1 12/2021 Choi et al.
2022/0199681 A1 6/2022 Lee et al.
2024/0268155 A1* 8/2024 Baek .................... H10K 59/873
2025/0040392 A1* 1/2025 Song ...................... H10K 59/12
2025/0040413 A1* 1/2025 Lim ..................... H10K 59/879

FOREIGN PATENT DOCUMENTS

JP 2015-88418 A 5/2015
KR 10-2006-0114086 A 11/2006
KR 10-2011-0073210 A 6/2011
KR 20160032970 A * 3/2016 ............. H10K 71/00
KR 10-2017-0019509 A 2/2017
KR 10-2022-0089997 A 6/2022

* cited by examiner

*Primary Examiner* — Mariceli Santiago

(74) *Attorney, Agent, or Firm* — Morgan, Lewis & Bockius LLP

(57) ABSTRACT

A light emitting display device includes a trench, which includes: a bank which is on a substrate, is formed along a boundary of a pixel region, and has an opening therein; an inclined reflective portion below the bank; a light emitting diode disposed in the opening; a capping layer which is on the light emitting diode, and includes a plurality of half-donut-shaped first lenses at a top surface of the capping layer, and a second lens which is on the capping layer, and is disposed to correspond to the light emitting diode.

20 Claims, 9 Drawing Sheets

FIG. 10

LIGHT EMITTING DISPLAY DEVICE

CROSS REFERENCE TO RELATED APPLICATIONS

The present application claims the priority benefit of Korean Patent Application No. 10-2022-0189146 filed in Republic of Korea on Dec. 29, 2022, which is hereby incorporated by reference in its entirety for all purposes as if fully set forth herein.

BACKGROUND

Technical Field

The present invention relates to a light emitting display device.

Discussion of the Related Art

Recently, flat panel display devices having excellent characteristics such as thinness, light weight, and low power consumption have been widely developed and applied to various fields.

Among the flat panel display devices, a light emitting display device uses a light emitting element in which charges are injected into a light emitting layer formed between a cathode as an electron injection electrode and an anode as a hole injection electrode so that electrons and holes pair up and then annihilate to emit light.

In general, the light emitting display device has a small luminance viewing angle and needs to improve light efficiency.

SUMMARY

Accordingly, embodiments of the present disclosure are directed to a light emitting display device that substantially obviates one or more of the problems due to limitations and disadvantages of the related art.

An aspect of the present disclosure is to provide a light emitting display device which can improve a luminance viewing angle and a light efficiency.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a light emitting display device comprises: a bank which is on a substrate, is formed along a boundary of a pixel region, and has an opening therein: an inclined reflective portion below the bank: a light emitting diode disposed in the opening: a capping layer which is on the light emitting diode, and includes a plurality of half-donut-shaped first lenses at a top surface of the capping layer: and a second lens which is on the capping layer, and is disposed to correspond to the light emitting diode.

In another aspect, a light emitting display device comprises: a bank which is on a substrate, is formed along a boundary of each of red, green, and blue pixel regions, and has an opening therein: an inclined reflective portion which is below the bank and is disposed in each of the red and green pixel regions: a light emitting diode disposed in the opening in each of the red, green, and blue pixel regions: a first capping layer which is on the light emitting diode of the blue pixel region, and has a plurality of half-donut-shaped first lenses at a top surface of the first capping layer: a second capping layer which is on the light emitting diode of each of the red and green pixel regions, and has a smooth top surface: and a second lens which corresponds to the light emitting diode of each of the red, green, and blue pixel regions, and is disposed on the corresponding first or second capping layer.

It is to be understood that both the foregoing general description and the following detailed description are exemplary and explanatory and are intended to provide further explanation of the inventive concepts as claimed as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain various principles of the disclosure. In the drawings:

FIG. 10 is a cross-sectional view illustrating another example of a capping layer of a light emitting display device according to a third embodiment of the present invention:

DETAILED DESCRIPTION

Figure 1:
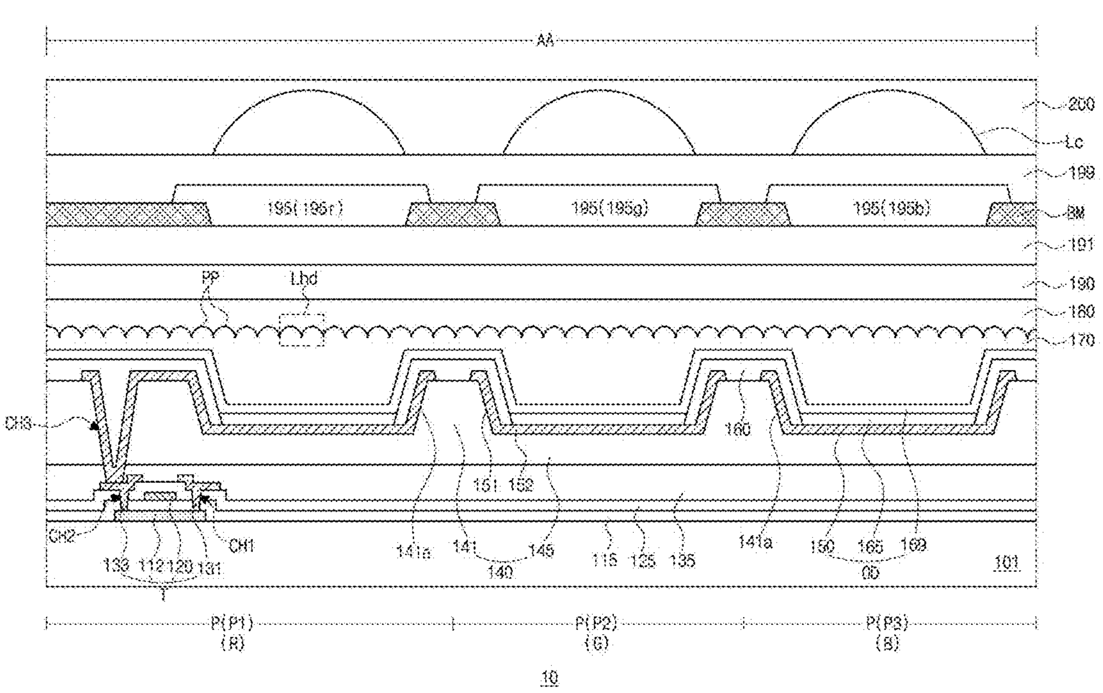
FIG. 1 is a cross-sectional view schematically illustrating a light emitting display device according to a first embodiment of the present invention.

Advantages and features of the present invention and methods of achieving them will be apparent with reference to the embodiments described below in detail with the accompanying drawings. However, the present invention is not limited to the embodiments disclosed below, but can be realized in a variety of different forms, and only these embodiments allow the present invention to be complete. The present invention is provided to fully inform the scope of the invention to the skilled in the art of the present invention, and the present invention can be defined by the scope of the claims.

The shapes, sizes, proportions, angles, numbers, and the like disclosed in the drawings for explaining the embodiments of the present invention are illustrative, and the present invention is not limited to the illustrated matters. The same reference numerals refer to the same components throughout the description.

Furthermore, in describing the present invention, if it is determined that a detailed description of the related known technology unnecessarily obscure the subject matter of the present invention, the detailed description thereof can be omitted. When 'comprising', 'including', 'having', 'consisting', and the like are used in this invention, other parts can be added unless 'only' is used. When a component is expressed in the singular, cases including the plural are included unless specific statement is described.

In interpreting the components, even if there is no separate explicit description, it is interpreted as including a margin range.

In the case of a description of a positional relationship, for example, when the positional relationship of two parts is described as 'on', 'over', 'above', 'below', 'beside', 'under', and the like, one or more other parts can be positioned between such two parts unless 'right' or 'directly' is used.

In the case of a description of a temporal relationship, for example, when a temporal precedence is described as 'after', 'following', 'before', and the like, cases that are not continuous can be included unless 'directly' or 'immediately' is used.

In describing components of the present invention, terms such as first, second and the like can be used. These terms are only for distinguishing the components from other components, and an essence, order, order, or number of the components is not limited by the terms. Further, when it is described that a component is "connected", "coupled" or "contact" to another component, the component can be directly connected or contact the another component, but it should be understood that other component can be "interposed" between the components.

Respective features of various embodiments of the present invention can be partially or wholly connected to or combined with each other and can be technically interlocked and driven variously, and respective embodiments can be independently implemented from each other or can be implemented together with a related relationship.

Hereinafter, embodiments of the present invention are described in detail with reference to the drawings. Meanwhile, in the following embodiments, the same and like reference numerals are assigned to the same and like components, and detailed descriptions thereof may be omitted.

First Embodiment

Figure 2:
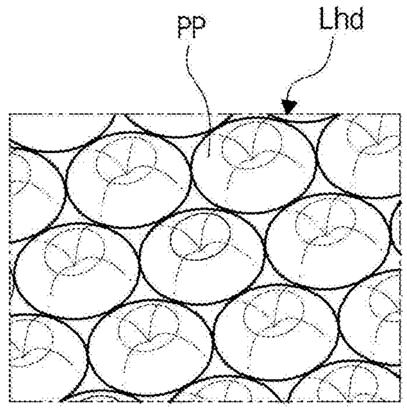
FIGS. 2 to 4 are a perspective view, a plan view, and a cross-sectional view, respectively, schematically illustrating a structure of a lens of a capping layer according to the first embodiment of the present invention.
Figure 3:
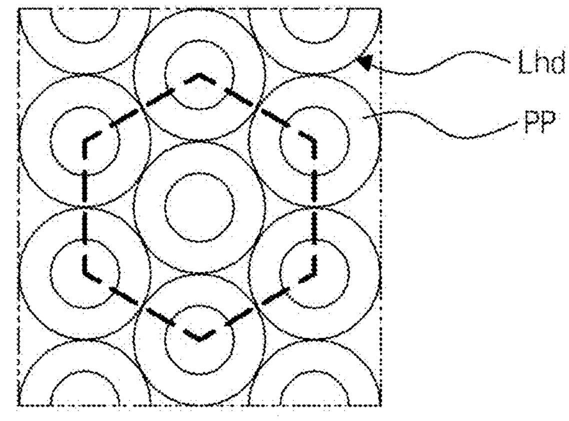
Figure 4:
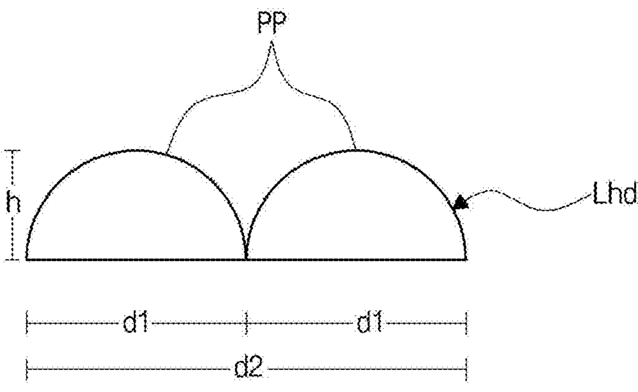

FIG. 1 is a cross-sectional view schematically illustrating a light emitting display device according to a first embodiment of the present invention. FIGS. 2 to 4 are a perspective view, a plan view, and a cross-sectional view, respectively, schematically illustrating a structure of a lens of a capping layer according to the first embodiment of the present invention.

Prior to a detailed description, the light emitting display device 10 according to the first embodiment of the present invention may include all types of display devices that include a light emitting diode OD, which is a self-light emitting element, to display images.

In this embodiment, for convenience of explanation, a case in which an organic light emitting display device is used as the light emitting display device 10 is taken as an example.

Referring to FIG. 1, the light emitting display device 10 of this embodiment may be a top emission type display device in which light is output toward a top over a substrate 101 to display an image.

On the substrate 101 of the light emitting display device 10, a plurality of pixel regions P may be arranged in a matrix form in a display region AA for displaying an image. Meanwhile, although not specifically shown, a plurality of gate lines extending along a row direction and a plurality of data lines extending along a column direction may be formed on the substrate 101. Each pixel region P may be connected to the corresponding gate line and data line.

The plurality of pixel regions P may include subpixels that constitute a unit pixel and display first, second and third colors as different colors, for example, red (R), green (G), and blue (B) subpixels P1, P2, and P3 respectively displaying red, green, and blue. For convenience of explanation, the R, G, and B pixel regions P1, P2, and P3 may be referred to as the first, second, and third pixel regions P1, P2, and P3, respectively.

In each pixel region P, a plurality of thin film transistors, at least one capacitor, and a light emitting diode OD may be formed on the substrate 101. Meanwhile, in FIG. 1, for convenience of explanation, one thin film transistor T, for example, a driving thin film transistor T located in the first pixel region P1 is shown.

In more detail, a semiconductor layer 112 may be formed on an inner surface of the substrate 101. The semiconductor layer 112 may be made of amorphous silicon, polycrystalline silicon, or oxide semiconductor material, but is not limited thereto.

The semiconductor layer 112 may include a central channel region and source and drain regions on both sides of the channel region.

A gate insulating layer 115 may be formed on the semiconductor layer 112 as an insulating layer made of an insulating material. The gate insulating layer 115 may be formed of an inorganic insulating material such as silicon oxide or silicon nitride, but is not limited thereto.

A gate electrode 120 made of a conductive material such as metal may be formed on the gate insulating layer 115 to correspond to the channel region of the semiconductor layer 112.

In addition, the gate line connected to a gate electrode of a switching thin film transistor (not shown) may be formed on the gate insulating layer 115.

On the gate electrode 120, a first interlayered insulating layer 125 may be formed on the entire surface of the substrate 101 as an insulating layer made of an insulating material.

The first interlayered insulating layer 125 may be formed of an inorganic insulating material such as silicon oxide or silicon nitride, or may be formed of an organic insulating material such as benzocyclobutene or photo acryl, but is not limited thereto.

In the first interlayered insulating layer 125 and the gate insulating layer 115 therebelow, a first contact hole CH1 and a second contact hole CH2 exposing the source region and drain region of the semiconductor layer 112, respectively may be provided.

The first contact hole CH1 and the second contact hole CH2 may be located on both sides of the gate electrode 120 and spaced apart from the gate electrode 120.

A source electrode 131 and a drain electrode 133 made of a conductive material such as metal may be formed on the first interlayered insulating layer 125.

Additionally, the data line may be formed on the first interlayered insulating layer 125 to cross the gate line and be connected to a source electrode of the switching thin film transistor.

The source electrode 131 and the drain electrode 133 may be located spaced apart from each other with the gate electrode 120 located therebetween, and contact the source region and the drain region of the semiconductor layer 112 through the first contact hole CH1 and the second contact hole CH2, respectively.

The semiconductor layer 112, the gate electrode 120, the source electrode 131, and the drain electrode 133 configured as above may form the thin film transistor T.

As another example, the thin film transistor T may have an inverted staggered structure in which the gate electrode 120 is located below the semiconductor layer 112 and the source electrode 131 and the drain electrode 133 are located on the semiconductor layer 112.

A second interlayered insulating layer 135 may be formed, as an insulating layer made of an insulating material, on the source electrode 131 and the drain electrode 133 and over the entire surface of the substrate 101.

The second interlayered insulating layer 135 may be formed of an inorganic insulating material such as silicon oxide or silicon nitride, but is not limited thereto.

An overcoat layer (or planarization layer) 140 may be formed on the second interlayered insulating layer 135. The overcoat layer 140 may be formed of an organic insulating material such as benzocyclobutene or photo acryl, but is not limited thereto.

A third contact hole (or drain contact hole) CH3 exposing the drain electrode 133 may be formed in the overcoat layer 140 and the second interlayered insulating layer 135.

The overcoat layer 140 may include a protrusion (or partition) 141 that protrudes upward along a boundary (or edge) of each pixel region P. Due to the protrusion 141, a concave groove defined inside the protrusion 141 may be formed in the overcoat layer 140. Meanwhile, a portion of the overcoat layer 140 located below the concave groove may have a substantially flat top (or upper) surface, and may be referred to as a flat portion (or base portion) 145.

The protrusion 141 may be configured to have a tapered shape that is narrow in width toward a top. Accordingly, a side surface 141*a* of the protrusion 141 may be configured as an inclined surface. In this regard, the side surface 141*a* of the protrusion 141 may be configured to have a shape inclined outward with respect to the corresponding pixel region P.

A first electrode (or anode) 150 may be formed on the overcoat layer 140 for each pixel region P.

The first electrode 150 of each pixel region P may be located corresponding to each concave groove of the overcoat layer 140, and may have a structure that is separated from the first electrode 150 of the neighboring pixel region P with the protrusion 141 therebetween. For example, on the top surface of the protrusion 141, the neighboring first electrodes 150 may be spaced apart from each other.

The first electrode 150 may include a metal material with high reflectance. For example, the first electrode 150 may include Al, Ag, Ti, or APC (Al—Pd—Cu) alloy, but is not limited thereto.

Meanwhile, the first electrode 150 may be formed as a single-layer structure or a multi-layer structure. In the case of forming a multi-layer structure, for example, the first electrode 150 may be configured in a laminated structure of Al and Ti (e.g., Ti/Al/Ti), a laminated structure of Al and ITO (e.g., ITO/Al/ITO), or a laminated structure of APC alloy and ITO (e.g., ITO/APC/ITO), but is not limited thereto.

The first electrode 150 may include a reflective portion 151 formed along the inclined side surface 141*a* of the overcoat layer 140. The reflective portion 151 may have a shape that extends obliquely upward from an end of the first electrode 150 located on the flat portion 145 of the overcoat layer 140. Here, a portion of the first electrode 150 in a flat form located on the flat portion 145 of the overcoat layer 140 may be referred to as an even portion (or base portion) 152.

A bank 160 may be formed on the first electrode 150 to cover an edge of the first electrode 150. The bank 160 may be arranged along the boundary of the pixel region P, and cover the edge portion of the first electrode 150, including the reflective portion 151, and the protrusion 141 of the overcoat layer 140.

The bank 160 may be formed of, for example, at least one of acrylic resin, epoxy resin, phenol resin, polyamide resin, polyimide resin, unsaturated polyester resin, polyphenylene resin, polyphenylene sulfide resin, benzocyclobutene, and photoresist, but is not limited thereto.

The bank 160 may have an opening therein exposing the first electrode 150 of each pixel region P.

A light emitting layer 165 may be formed on the first electrode 150 of each pixel region P. This light emitting layer 165 may contact the first electrode 150 exposed through the opening of the bank 160.

The light emitting layer 165 may be formed by each pixel area P or may be formed continuously corresponding to all pixel regions P substantially along the entire surface of the substrate 101. In this embodiment, for convenience of explanation, a case where the light emitting layer 165 is formed for the pixel region P is taken as an example.

The light emitting layer 165 of each pixel region P may be formed of a white light emitting layer that emits white light. As another example, the light emitting layer 165 of each pixel area P may be formed of a light emitting layer that emits a color of the corresponding pixel region. For example, the first, second, and third pixel regions P1, P2, and P3 may include red (R), green (G), and blue (B) light emitting layers, respectively.

A second electrode (or cathode) 169 may be formed on the light emitting layer 165 and over the entire surface of the substrate 101.

The second electrode 169 may be formed of a transparent electrode with transparent characteristics, and in this case, it may be made of a transparent conductive material such as ITO.

Meanwhile, in a case of implementing a micro cavity effect, the second electrode 169 may be configured to include a transflective electrode layer having transflective characteristics, and may be configured with a multi-layer structure including the transflective electrode layer. The transflective electrode layer of the second electrode 169 may be formed of a metal material such as magnesium (Mg), silver (Ag), or an alloy of magnesium (Mg) and silver (Ag), but is not limited thereto. Such the metal material may be formed to a thickness thin enough to realize transflective characteristics.

The first electrode 150, the light emitting layer 165, and the second electrode 169 arranged as above at the opening OP in the pixel region P may form the light emitting diode OD.

The light emitting diode OD may emit light from the light emitting layer 165 interposed between the first and second electrodes 150 and 169, and the light emitted in this way can travel upward and be output.

Meanwhile, some of the light emitted from the light emitting layer 165 may propagate while being totally reflected in a lateral direction of the pixel region P and become trapped inside the display device. The so-called waveguide mode light traveling in the lateral direction may be reflected by the reflective portion 151 of the first electrode 150 and then output upward. In this way, the reflective portion 151 of the first electrode 150 may function as a mirror that reflects light traveling in the lateral direction upward.

By using the reflective portion 151 of the first electrode 150, a light extraction efficiency of the light emitting display device 10 can be maximized.

A capping layer 170 may be formed on the second electrode 169 to substantially cover the entire surface of the second electrode 169.

A plurality of fine-sized lenses Lhd each having a half-donut shape may be provided at a top surface of the capping layer 170. The lenses Lhd may be repeatedly arranged throughout the display region AA of the light emitting display device 10. Here, for convenience of explanation, the lens Lhd of the capping layer 170 may be referred to as the first lens Lhd.

The capping layer 170 may have a high refractive index, for example, a refractive index of 1.6 to 1.8. In addition, the capping layer 170 may be formed of an organic material, for example, a self-crystallization material. In this case, when the capping layer 170 is formed, the half-donut-shaped lens Lhd may be spontaneously formed on the surface. Alternatively, the capping layer 170 may be formed of a material different from the self-crystallization material.

The structure of the first lens Lhd is described with reference to FIGS. 2 to 4. As the first lens Lhd may be formed to have the half-donut shape, it may include a convex portion PP that protrudes convexly upward from the top surface of the capping layer 170.

The convex portion PP may have a shape in which its cross section is rotated circularly in a circumferential direction in a plan view with respect to a center of the first lens Lhd. Accordingly, the convex portion PP may define a concave groove therein, so that the first lens Lhd may have the half-donut shape including the convex portion PP surrounding the concave groove.

In this embodiment, a case where the convex portion PP has a first diameter d1, and the first lens Lhd has a second diameter d2 (=2*d1) that is twice the first diameter d1 is taken as an example. In this case, it is configured that with respect to the center of the first lens Lhd, an inner end of a part of the convex portion PP located on one side (e.g., the left side of FIG. 4) contacts (meets) an inner end of a part of the convex portion PP located on the other side (e.g., the right side of FIG. 4).

Here, the second diameter d2 may be a very small size compared to a width of the pixel region P, for example, may be approximately 0.1 μm to 2 μm, but is not limited thereto. A height h of the convex portion PP may be approximately ½ (i.e., d1/2) of the first diameter d1, but is not limited thereto.

The plurality of first lenses Lhd having the half-donut shape configured as above may be repeatedly and densely arranged within each pixel region P.

The arrangement of the first lenses Lhd refers to FIG. 3. In this regard, when viewed in plan, the first lens Lhd may have the densest arrangement form, for example, a regular hexagonal arrangement structure in which with one first lens Lhd as a center, six first lenses Lhd surround the one first lens Lhd at the center. Due to this regular hexagonal arrangement structure, the neighboring first lenses Lhd are arranged to be in contact with each other substantially without being spaced apart, so that the density of the first lenses Lhd can be maximized.

This first lens Lhd can have high light extraction and scattering characteristics due to its half-donut shape. This refers to FIG. 5.

Figure 5:
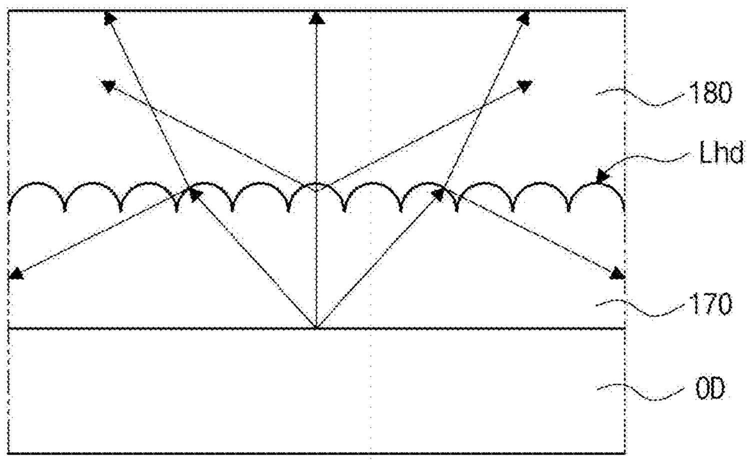
FIG. 5 is a view illustrating optical characteristics of half-donut shaped first lenses according to the first embodiment of the present invention.

FIG. 5 is a view illustrating optical characteristics of half-donut shaped first lenses according to the first embodiment of the present invention.

Referring to FIG. 5, light traveling upward from the capping layer 170 may not only proceed upward while passing through the first lens Lhd at the top surface of the capping layer 170, but may also be refracted and proceed in the lateral direction. In this way, the first lens Lhd of the capping layer 170 has scattering characteristics that refract light in the lateral direction, so an amount of light in the lateral direction can be increased. Accordingly, a luminance viewing angle of the display device can be improved (or widened).

In addition, for light traveling obliquely in the lateral direction in the capping layer 170, if the first lens Lhd does not exist and the top surface of the capping layer 170 is flat, the light propagates while being totally reflected in the lateral direction and may be trapped inside a display device as light in a waveguide mode. In contrast, when the first lens Lhd is formed as in the present embodiment, the light in the waveguide mode traveling in the lateral direction has an incident angle at the first lens Lhd that is less than a total reflection critical angle, so that it can pass through the capping layer 170 and proceed upward. As such, due to the first lens Lhd, the light extraction efficiency of the light emitting display device 10 can also be improved.

Meanwhile, the top surface of the capping layer 170 configured as above may be positioned entirely higher than a height of the second electrode 169 therebelow. In this regard, the capping layer 170 may cover substantially the entire second electrode 169 with its top surface having substantially uniform height (for example, a distance from the substrate 101 to the top surface of the capping layer 170 being uniform).

An encapsulation film 180 may be formed on the capping layer 170. The encapsulation film 180 may serve to prevent oxygen or moisture from penetrating into the light emitting diode OD.

The encapsulation film 180 may include, for example, at least one inorganic film and at least one organic film. Although not specifically shown, for example, the encapsulation film 180 may be formed in a structure in which a first inorganic film, an organic film on the first inorganic film, and a second inorganic film on the organic film are stacked.

The encapsulation film 180 as described above may have a lower refractive index than the capping layer 170 therebelow, for example, a refractive index of 1.4 to 1.5.

A touch element layer 190 may be formed on the encapsulation film 180. Although not specifically shown, a touch electrode may be disposed in the touch element layer 190 to detect a change in capacitance when a user touches it.

A protective film (or buffer film) 191 that protects the touch element layer 190 may be disposed on the touch element layer 190.

A black matrix BM and a color filter layer 195 may be disposed on the protective film 191.

In this regard, the black matrix BM may be formed corresponding to the edge of each pixel region P. Here, in order to maximize the amount of light passing through an opening of the black matrix BM, the side end of the black matrix BM may be configured to, for example, be located outside the top end of the reflective portion 151, but is not limited thereto.

The color filter layer 195 may be formed corresponding to each pixel region P. The color filter layer 195 may include red, green, and blue color filters 195*r*, 195*g*, and 195*b* corresponding to the first, second, and third pixel regions P1, P2, and P3, respectively.

In this way, by forming the color filters 195*r*, 195*g*, and 195*b* corresponding to the respective pixel regions P, color purity of light emitted from the respective pixel regions P can be improved.

An overcoat film 199 may be formed on the black matrix BM and the color filter layer 195 to cover and protect them. The substrate on which the overcoat film 199 is formed may have a substantially flat surface.

On the overcoat film 199, a plurality of lenses Lc respectively corresponding to the plurality of pixel regions P may be formed. The lens Lc may have a convex semicircular shape. Here, for convenience of explanation, the lens Lc may be referred to as a second lens Lc.

The second lens Lc functions to collect light due to its convex semicircular shape, thereby improving a front luminance of the light emitting display device 10.

The second lens Lc may have a high refractive index, for example, it may have a refractive index of approximately 1.6 to 1.8, which is the same as or close to that of the first lens Lhd.

As above, the second lens Lc may be formed to correspond to each pixel region P, that is, the pixel region P and the second lens Lc may have a one-to-one correspondence. Meanwhile, as mentioned earlier, the first lens Lhd may have a very small size compared to the pixel region P, and a very large number of first lenses Lhd may be arranged corresponding to each pixel region P. Thus, the first lens Lhd may have a very small size compared to the second lens Lc, and the plurality of first lenses Lhd may be arranged to correspond to each second lens Lc.

A planarization film 200 for planarizing the substrate may be formed on the second lens Lc and the overcoat film 199.

The planarization film 200 may have a refractive index that is smaller than that of the second lens Lc therebelow, for example, may have a refractive index of approximately 1.4 to 1.5.

Meanwhile, in this embodiment, it is preferable that the reflector 151 of the first electrode 150, the first lens Lhd of the capping layer 180, and the second lens Lc, which are main components related to increasing light efficiency and luminance viewing angle, are arranged to match each other in order to maximize light efficiency and luminance viewing angle.

Figure 6:
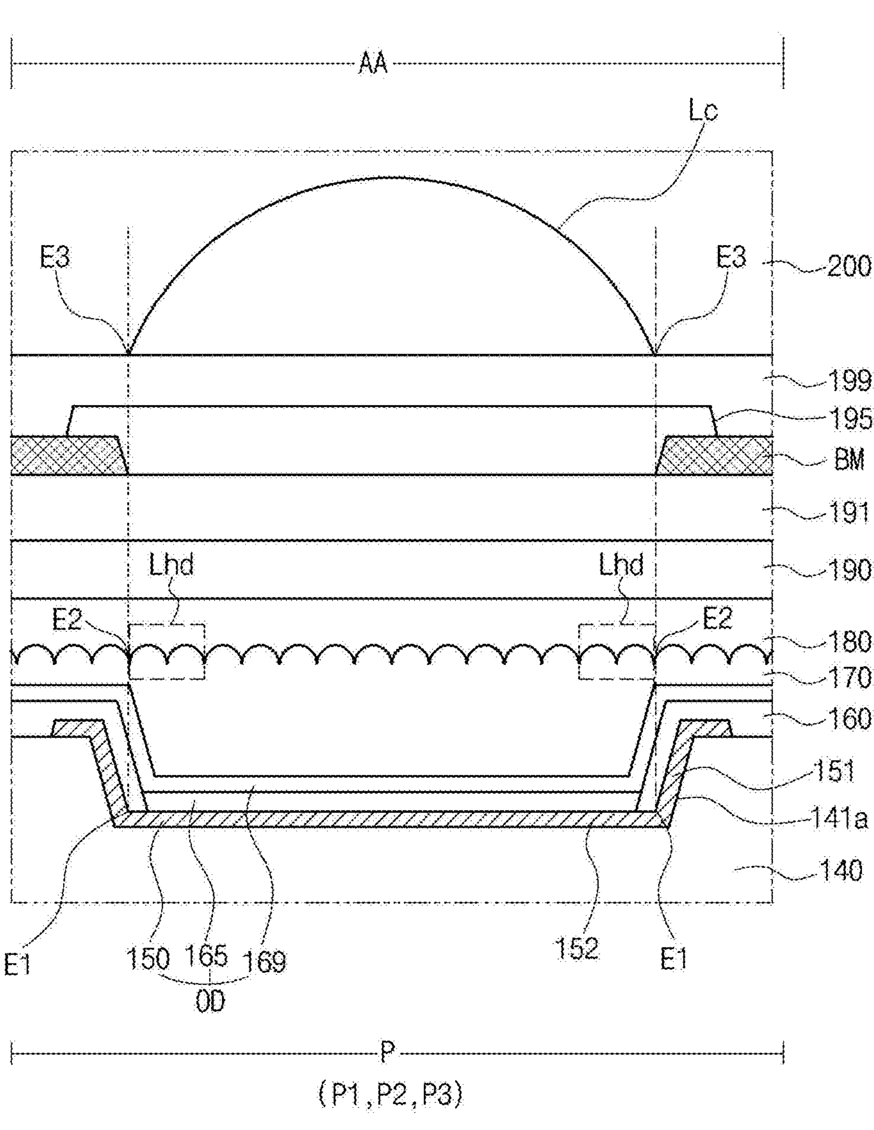
FIG. 6 is a cross-sectional view schematically illustrating a cross-sectional structure of one pixel region according to the first embodiment of the present invention.
Figure 7:
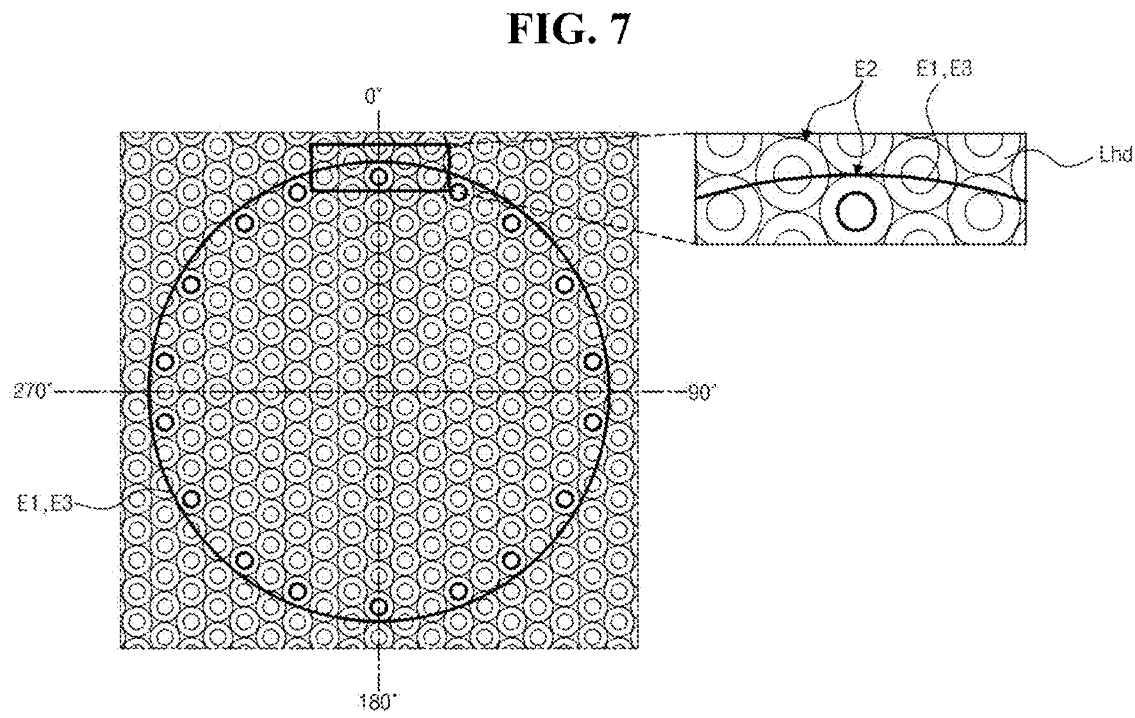
FIG. 7 is a plan view schematically illustrating a planar arrangement relationship between a reflective portion of a first electrode, a first lens of a capping layer, and a second lens according to the first embodiment of the present invention.

This is described in more detail with further reference to FIGS. 6 and 7.

FIG. 6 is a cross-sectional view schematically illustrating a cross-sectional structure of one pixel region according to the first embodiment of the present invention, and FIG. 7 is a plan view schematically illustrating a planar arrangement relationship between a reflective portion of a first electrode, a first lens of a capping layer, and a second lens according to the first embodiment of the present invention. Meanwhile, in FIG. 6, components below the overcoat layer 140 are omitted for convenience of explanation.

Referring to FIGS. 6 and 7, a bottom (or lower) end E1 of the inclined reflective portion 151 of the first electrode 150 (or an end of the even portion 152 of the first electrode 150), a side end E2 of the first lens Lhd of the capping layer 170 located over the lower end E1, and a side end E3 of the second lens Lc located over the side end E2 may be arranged to be substantially on the same line that is perpendicular to a plane of the substrate 101.

Here, when viewed in a plan view with reference to FIG. 7, a line of the bottom end E1 of the reflective portion 151 (or a circumference line of the bottom end E1) may be matched in position to entirely coincide with a line of the side end E3 of the second lens Lc (or a circumference line along the side end E3).

In addition, among the first lenses Lhd located in a portion where the bottom end (E1) line of the reflective portions 151 and the side end (E3) line of the second lens Lc pass, the side ends E2 of some first lenses Lhd (indicated in bold in FIG. 7) may be matched in position to coincides with the bottom end (E1) line of the reflective portions 151 and the side end (E3) line of the second lens Lc.

In this regard, for example, in FIG. 7, the side end E2 of the first lens Lhd located at an azimuth of 0 degrees (for example, an upper or lower side on a plane of the light emitting display device 10) may be configured to be placed on the bottom end (E1) line of the reflector 151 and the side end (E3) line of the second lens Lc. In this case, a number of the first lenses Lhd whose side ends E2 are located at the bottom (E1) line of the reflector 151 and the side end (E3) line of the second lens Lc can be maximum.

Here, when a number of the first lenses Lhd having the side ends E2 which are matched in position with the bottom end E1 of the reflector 151 and the side end E3 of the second lens Lc is reduced, mismatching of optical path in an upper and lower direction increases, thereby causing an increase in light extinction.

As in this embodiment, by maximizing a number of the first lenses Lhd having the side ends E2 which are matched in position with the bottom end E1 of the reflector 151 and the side end E3 of the second lens Lc, optical path mismatching can be minimized, thereby minimizing a light extinction phenomenon. Accordingly, light efficiency and luminance viewing angle of the light emitting display device 10 can be maximized.

As described above, according to this embodiment, the light extraction can be maximized by forming the inclined reflective portion 151 of the first electrode 150 at the edge of the pixel region P, the luminance viewing angle can be increased by forming the fine first lenses Lhd with scattering characteristics having the half-donut shape at the capping layer 170 on the light emitting diode OD, and the front luminance can be increased by forming the convex second lens Lc on the capping layer 170.

Moreover, by matching the lower end E1 of the reflective portion 151, the side end E3 of the second lens Lc, and the side end E2 of the first lens Lhd, light extinction due to mismatching can be minimized. Accordingly, the light efficiency and luminance viewing angle of the light emitting display device 10 can be maximized.

As such, as the light efficiency and luminance viewing angle of the light emitting display device 10 are maximized, in implementing the same optical characteristics, power consumption can be reduced compared to the conventional light emitting display devices.

Second Embodiment

Figure 8:
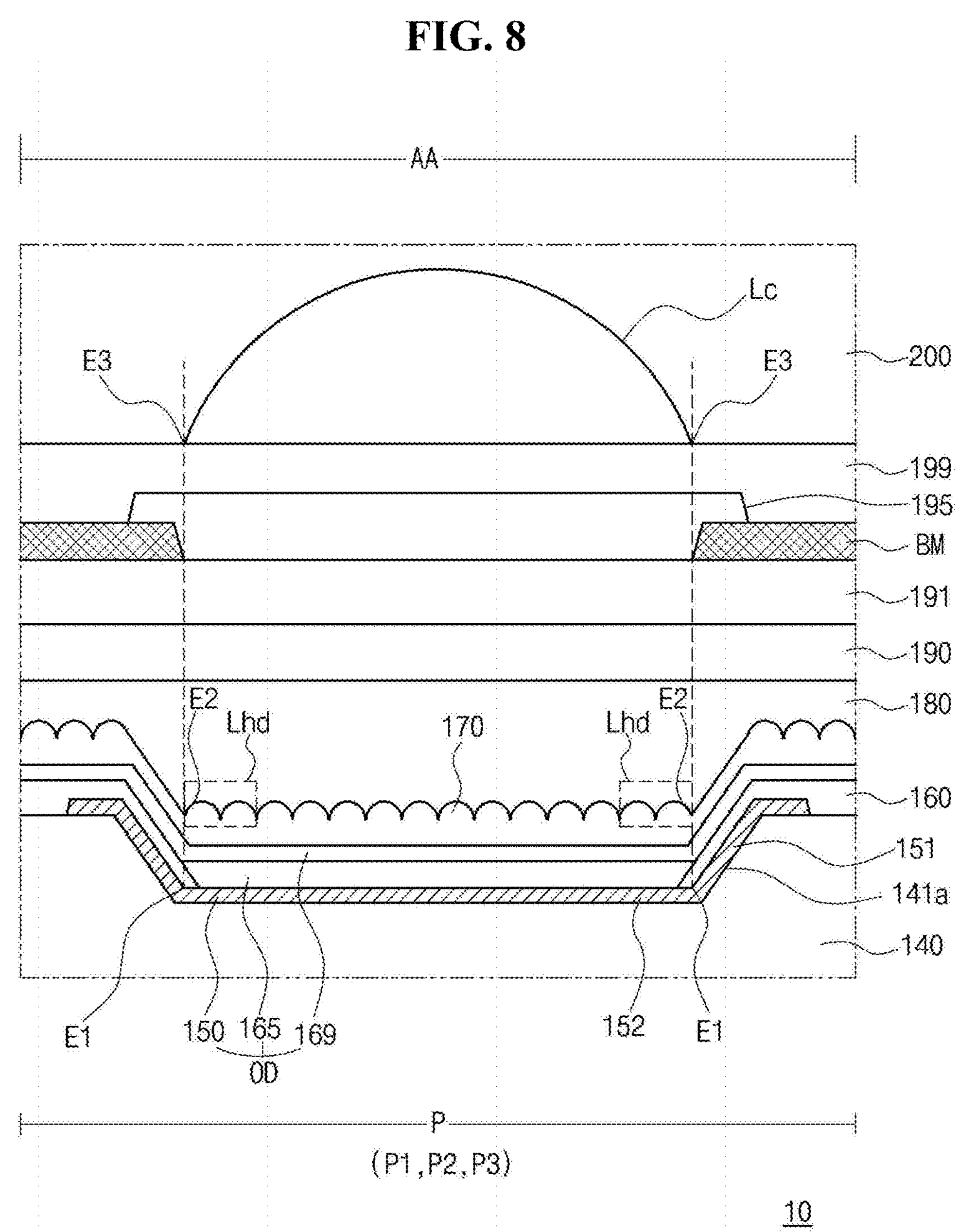
FIG. 8 is a cross-sectional view schematically illustrating a pixel region of a light emitting display device according to a second embodiment of the present invention.

FIG. 8 is a cross-sectional view schematically illustrating a pixel region of a light emitting display device according to a second embodiment of the present invention.

In FIG. 8, for convenience of explanation, configurations of the light emitting display device related to this embodiment are mainly shown.

In addition, in the following description, detailed explanations of configurations identical or similar to those of the above-described first embodiment may be omitted.

Referring to FIG. 8, in the light emitting display device 10 of this embodiment, the entire capping layer 170 may have substantially the same (or uniform) thickness and may be formed continuously along the top surface of the second electrode 169.

Accordingly, the top surface of the capping layer 170 may also have substantially the same shape as the top surface of the second electrode 169.

Here, a height of the top surface of a part of the capping layer 170 located within the opening of the bank 160 may be configured to be lower than a height of the top surface of a part of the capping layer 170 located on the top surface of the bank 160. In addition, the height of the top surface of the part of the capping layer 170 located within the opening of the bank 160 may be formed to be lower than the top surface of the bank 160 or the top surface of the second electrode 169 located on the bank 160.

As such, the capping layer 170 of this embodiment may be formed to have a thickness less than that of the capping layer 170 of the first embodiment described above.

As the capping layer 170 is formed to a small thickness, a material cost of the capping layer 170 can be reduced.

Meanwhile, regarding the capping layer 170 in this embodiment, as in the above-described first embodiment, its side end E2 may be formed to be matched with the bottom E1 of the reflective portion 151 of the first electrode 150 and the side end E3 of the second lens Lc, so that light efficiency and luminance viewing angle can be maximized.

Third Embodiment

Figure 9:
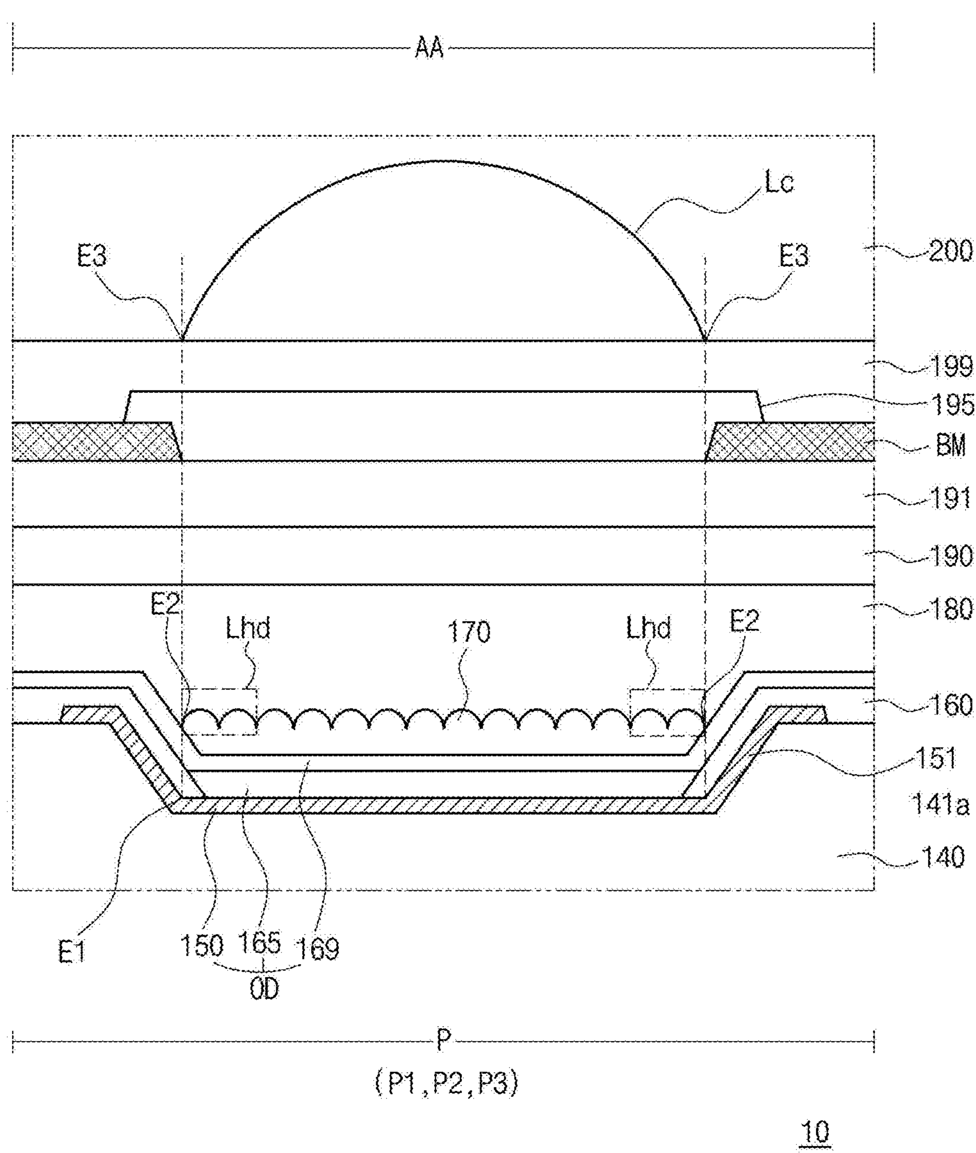
FIG. 9 is a cross-sectional view schematically illustrating a pixel region of a light emitting display device according to a third embodiment of the present invention.

FIG. 9 is a cross-sectional view schematically illustrating a pixel region of a light emitting display device according to a third embodiment of the present invention.

In FIG. 9, for convenience of explanation, configurations of the light emitting display device related to this embodiment are mainly shown.

In addition, in the following description, detailed explanations of configurations identical or similar to those of the first and second embodiments described above may be omitted.

Referring to FIG. 9, in the light emitting display device 10 of this embodiment, the capping layer 170 may be formed to be located in a partial region of each pixel region P. In other words, the capping layer 170 may be formed in a patterned form for each pixel region P, so that it may be physically separated from the capping layer 170 of the neighboring pixel region P.

For example, the capping layer 170 may be formed to correspond to the opening of the bank 160 located within each pixel region P. More specifically, it may be formed to correspond to and face the even portion 152 of the first electrode 150.

In this case, the capping layer 170 may not be substantially disposed on the reflective portion 151 of the first electrode 150.

In other words, in this embodiment, the capping layer 170 may be disposed to correspond to an effective (or actual) emission region (e.g., a region where the first electrode 150 and the light emitting layer 165 overlap and contact each other) within the pixel region P, and may not be disposed in the so-called reflective emission region where light is reflected and emitted (e.g., a region where the reflective portion 151 is disposed).

Accordingly, since the first lens Lhd with the scattering characteristics of the capping layer 170 is not located on the reflective portion 151, the light reflected and emitted by the reflective portion is not scattered by the first lens Lhd, so that light extraction efficiency in the front direction of the light emitting display device 10 can be maximized.

In addition, since the first lens Lhd of the capping layer 170 is located corresponding to the effective emission region of the pixel region P, sufficient scattered light can be generated in the lateral direction, and the luminance viewing angle can be significantly improved.

Meanwhile, the capping layer 170 of the light emitting display device 10 of FIG. 9 may be formed to have a small thickness, similar to the second embodiment.

In this regard, the height of the top surface of the capping layer 170 located within the opening of the bank 160 may be formed to be lower than that of the top surface of the bank 160 or the top surface of the second electrode 169 located on the bank 160.

Figure 10:
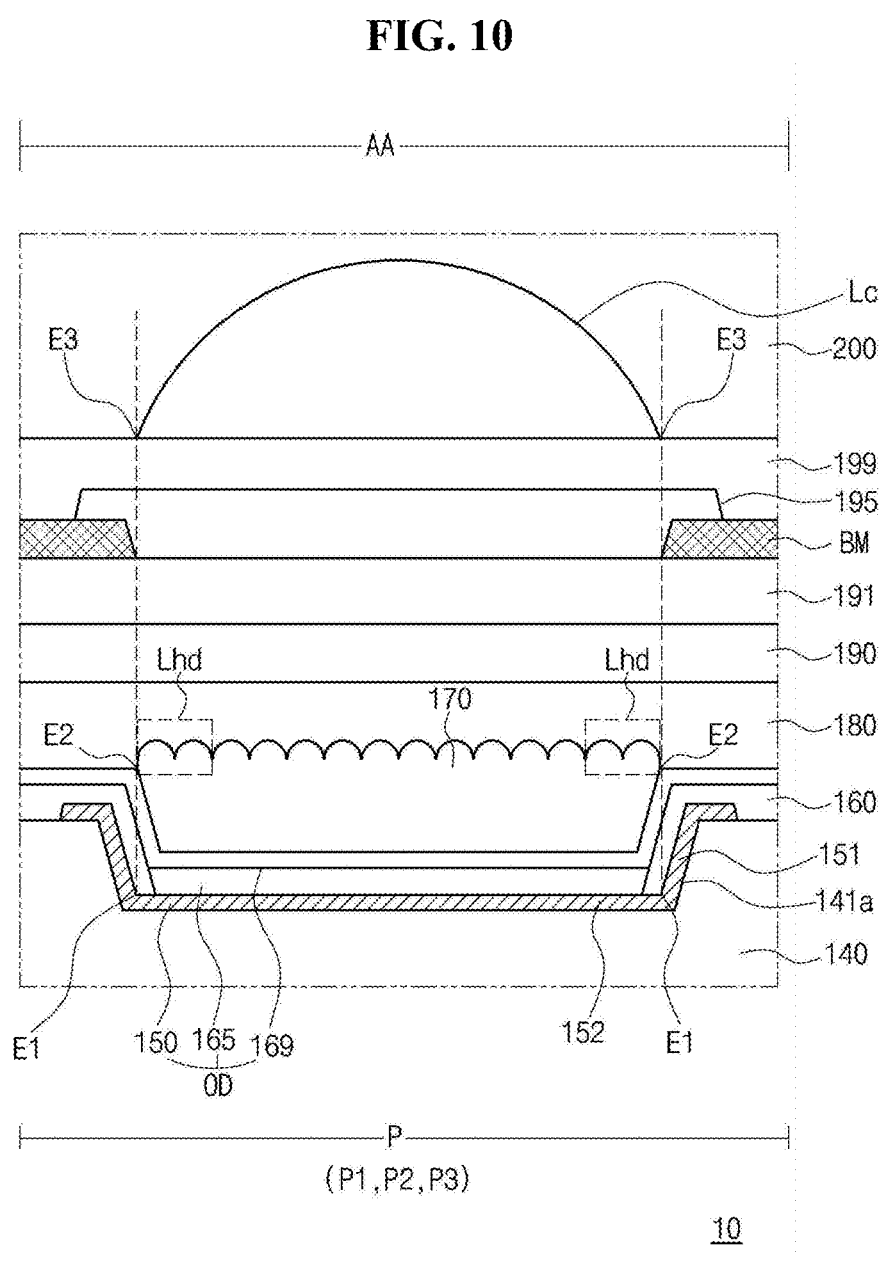

Meanwhile, unlike FIG. 9, the capping layer 170 may be formed to be higher than the top surface of the bank 160 or the top surface of the second electrode 169 on the bank 160, for which reference can be made to FIG. 10.

FIG. 10 is a cross-sectional view illustrating another example of a capping layer of a light emitting display device according to a third embodiment of the present invention.

Referring to FIG. 10, the top surface of the capping layer 170 may be formed to be higher than the top surface of the second electrode 169 on the bank 160.

As described above, the capping layer 170 in this embodiment may be formed in the part of each pixel region P. In this case, the material cost of the capping layer 170 can be reduced compared to the case where the capping layer 170 is formed over the entire pixel region P.

Fourth Embodiment

Figure 11:
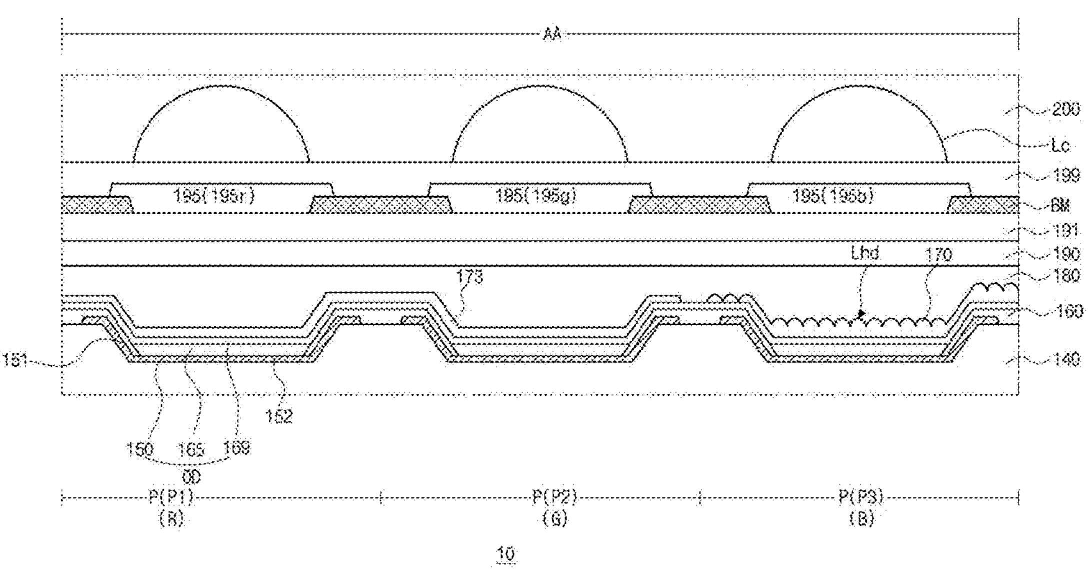
FIG. 11 is a cross-sectional view schematically illustrating pixel regions of a light emitting display device according to a fourth embodiment of the present invention.

FIG. 11 is a cross-sectional view schematically illustrating pixel regions of a light emitting display device according to a fourth embodiment of the present invention.

In FIG. 11, for convenience of explanation, configurations of the light emitting display device related to this embodiment are mainly shown.

In addition, in the following description, detailed explanations of configurations identical or similar to those of the first, second, and third embodiments described above may be omitted.

Referring to FIG. 11, in the light emitting display device 10 of this embodiment, the third pixel area P3, which displays blue of relatively short wavelength, may be provided with a first capping layer 170, as a capping layer 170, having the first lens Lhd of the half-doughnut shape with scattering characteristics. The first and second pixel areas P1 and P2, which display red and green of relatively long wavelength, be provided with a first capping layer 173, as a capping layer 173, having a smooth (or flat) surface without scattering characteristics. The second capping layer 173 may be formed of an organic material.

In this regard, light extraction of the pixel region P can be improved by forming the reflective portion 151 of the first electrode 150. However, there is a path difference between light which is generated in the effective emission and then output upward and light which is reflected and output by the reflective portion 151, so that a long-wavelength color shift may occur at the front of the display device. This long-wavelength color shift is visible especially through the third pixel region P3 displaying blue of short wavelength, and is not visible to the extent of being a problem through the first and second pixel regions P1 and P2 displaying red and green of relatively long wavelength.

Considering this, in this embodiment, the first lens Lhd with scattering characteristics may be placed in the blue third pixel region P3, and thus the long-wavelength color shift phenomenon in the front direction can be improved.

In this regard, light reflected through the reflective portion 151 of the third pixel region P3 can be scattered by the first lens Lhd, and the scattering effect of the first lens Lhd rather causes a short-wavelength color shift.

Thus, the long-wavelength color shift caused by the reflective portion 151 of the third pixel region P3 can be compensated for by the scattering effect of the first lens Lhd.

Accordingly, the color coordinate in the front direction of the light emitting display device 10 can be relieved without a substantial increase in the long-wavelength color component, so that the long-wavelength color shift at the front can be improved.

As above, according to this embodiment, by disposing the lens Lhd with scattering characteristics in the blue pixel region P3, the long-wavelength color shift can be relieved (or reduced) and the luminance viewing angle can be improved. In addition, the light efficiency can be maximized by not disposing the lens Lhd with scattering characteristics in the red and green pixel regions P1 and P2.

Meanwhile, the case in which the first capping layer 170 of this embodiment may be configured in a similar form to the capping layer of the second embodiment is taken as an example. However, the first capping layer 170 may be configured in a similar form to the capping layer of the first or third embodiment.

Fifth Embodiment

Figure 12:
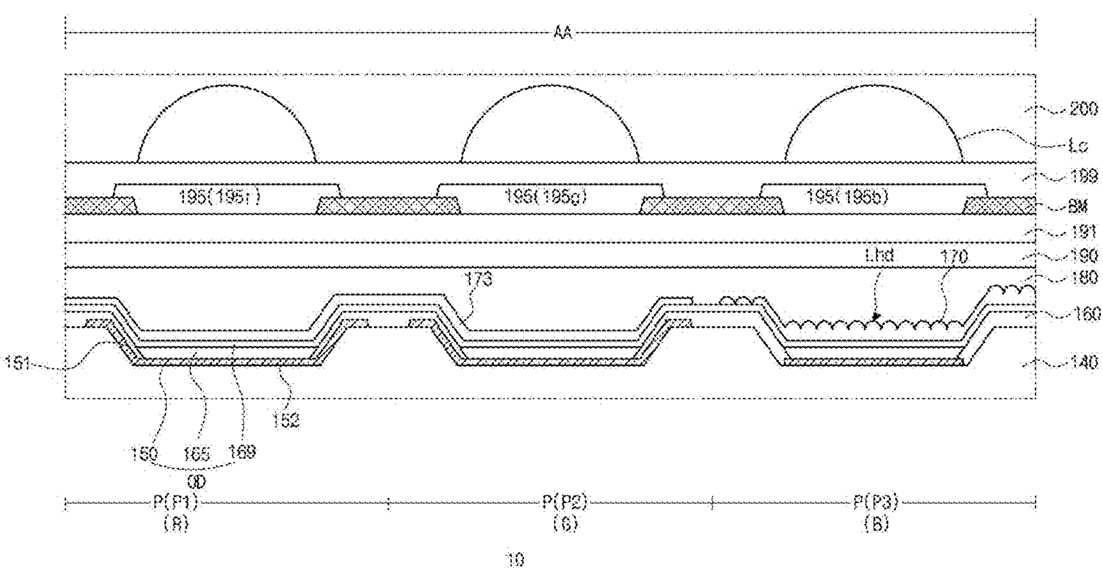
FIG. 12 is a cross-sectional view schematically illustrating pixel regions of a light emitting display device according to a fifth embodiment of the present invention.

FIG. 12 is a cross-sectional view schematically illustrating pixel regions of a light emitting display device according to a fifth embodiment of the present invention.

In FIG. 12, for convenience of explanation, configurations of the light emitting display device related to this embodiment are mainly shown.

In the following description, detailed descriptions of configurations identical or similar to those of the first, second, third, and fourth embodiments described above may be omitted.

Referring to FIG. 12, in the light emitting display device 10 of this embodiment, similar to the fourth embodiment, the third pixel area P3, which displays blue of relatively short wavelength, may be provided with a first capping layer 170, as a capping layer 170, having the first lens Lhd of the half-doughnut shape with scattering characteristics. The first and second pixel areas P1 and P2, which display red and green of relatively long wavelength, be provided with a first capping layer 173, as a capping layer 173, having a smooth (or flat) surface without scattering characteristics. The second capping layer 173 may be formed of an organic material.

Furthermore, in this embodiment, the first electrode 150 may not be provided with a reflective portion 151 in the blue third pixel region P3.

Accordingly, since the reflective portion 151 that causes a long-wavelength color shift is not formed in the third pixel region P3, the long-wavelength color shift caused by the reflective portion 151 can be minimized.

Moreover, by providing the first lens Lhd in the third pixel region P3, a short-wavelength color shift may occur.

Accordingly, the long-wavelength color component of the color coordinate in the front direction of the light emitting display device 10 is reduced, and the color purity (or color gamut) of blue in the front can be improved.

As above, according to this embodiment, by disposing the lens Lhd with scattering characteristics and omitting the reflective portion 151 in the blue pixel region P3, the long-wavelength color shift can be substantially prevented and the color purity of blue can be improved, and the luminance viewing angle can be improved. In addition, by not disposing the lens Lhd with scattering characteristics in the red and green pixel regions P1 and P2, the light efficiency can be maximized.

Figure 13:
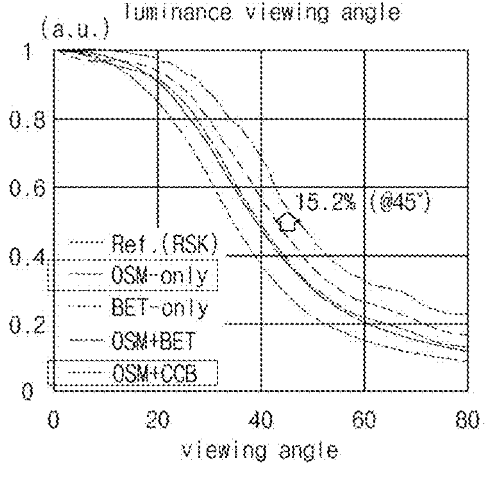
FIG. 13 is a view illustrating simulation results of luminance viewing angle and light efficiency according to an embodiment of the present invention.
Figure 13:
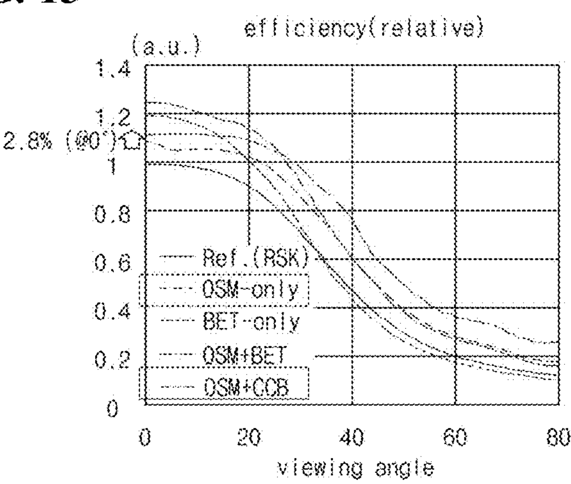

FIG. 13 is a view illustrating simulation results of luminance viewing angle and light efficiency according to an embodiment of the present invention.

In FIG. 13, the simulation result of the luminance viewing angle is shown on the left, and the simulation result of the light efficiency is shown on the right.

Meanwhile, in FIG. 13, "OSM+CCB" indicates the above-described second embodiment as an embodiment of the present invention. "OSM-only" indicates a case where only a reflector is provided without a first lens and a second lens, "BET-only" indicates a case where only a second lens is provided without a first lens and a reflective portion, and "OSM-BET" indicates a case where a reflective portion and a second lens is provided without a first lens. "Ref. (RSK)" indicates levels of luminance viewing angle and light efficiency level required for the display device.

Referring to FIG. 13, it can be seen that the luminance viewing angle of the embodiment of the present invention is at a higher level compared to other cases. For example, it can be seen that compared to "OSM-only", the luminance is higher by approximately 15.2% at a viewing angle of 45 degrees.

In addition, it can be seen that the light efficiency of the embodiment of the present invention is at an overall higher level compared to other cases. For example, it can be seen that compared to "OSM-only", the efficiency is higher by approximately 2.8% at a viewing angle of 0 degree.

As described above, the light extraction can be maximized by forming the inclined reflective portion at the edge of the pixel region, the luminance viewing angle can be increased by forming the fine first lenses with scattering characteristics having the half-donut shape at the capping layer on the light emitting diode, and the front luminance can be increased by forming the convex second lens on the capping layer.

Moreover, by matching the lower end of the reflective portion, the side end of the second lens, and the side end of the first lens, light extinction due to mismatching can be minimized. Accordingly, the light efficiency and luminance viewing angle of the light emitting display device 10 can be maximized.

As such, as the light efficiency and luminance viewing angle of the light emitting display device are maximized, in implementing the same optical characteristics, power consumption can be reduced compared to the conventional light emitting display devices.

In addition, by arranging the first lens with scattering characteristics in the blue pixel region, the long-wavelength color shift can be improved and the luminance viewing angle can be improved, and the light efficiency can be maximized by not arranging the lenses with scattering characteristics in the red and green pixel regions.

It will be apparent to those skilled in the art that various modifications and variations can be made in the light emitting display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A light emitting display device, comprising:

a bank which is on a substrate, is formed along a boundary of a pixel region, and has an opening therein;

an inclined reflective portion below the bank;

a light emitting diode disposed in the opening;

a capping layer which is on the light emitting diode, and includes a plurality of half-donut-shaped first lenses at a top surface of the capping layer; and a second lens which is on the capping layer, and is disposed to correspond to the light emitting diode.

2. The light emitting display device of claim 1, wherein a bottom end line of the reflective portion coincides with a side end line of the second lens, and side ends of some of the first lenses located in a region where the side end line of the second lens passes coincide with the side end line of the second lens.

3. The light emitting display device of claim 1, wherein the capping layer is disposed on the light emitting diode and the bank, and a top surface of the capping layer has a uniform height.

4. The light emitting display device of claim 1, wherein the capping layer is disposed on the light emitting diode and the bank, and wherein a height of the capping layer located on the bank is higher than that of the capping layer located on the light emitting diode.

5. The light emitting display device of claim 1, wherein the capping layer is formed in the opening by each pixel region, and a height of the capping layer is lower or higher than a top surface of the bank.

6. The light emitting display device of claim 1, wherein the capping layer is formed of a self-crystallization material.

7. The light emitting display device of claim 1, wherein the first lens is surrounded by six first lenses therearound.

8. The light emitting display device of claim 1, wherein the light emitting diode includes a first electrode, a light emitting layer on the first electrode, and a second electrode on the light emitting layer, and wherein the reflective portion extends from the first electrode of the light emitting diode.

9. The light emitting display device of claim 1, further comprising an encapsulation film disposed between the capping layer and the second lens.

10. A light emitting display device, comprising:

a bank which is on a substrate, is formed along a boundary of each of red, green, and blue pixel regions, and has an opening therein;

an inclined reflective portion which is below the bank and is disposed in each of the red and green pixel regions;

a light emitting diode disposed in the opening in each of the red, green, and blue pixel regions;

a first capping layer which is on the light emitting diode of the blue pixel region, and has a plurality of half-donut-shaped first lenses at a top surface of the first capping layer;

a second capping layer which is on the light emitting diode of each of the red and green pixel regions, and has a smooth top surface; and a second lens which corresponds to the light emitting diode of each of the red, green, and blue pixel regions, and is disposed on the corresponding first or second capping layer.

11. The light emitting display device of claim 10, wherein the reflection portion is omitted in the blue pixel region.

12. The light emitting display device of claim 10, wherein the reflector is disposed in the blue pixel region.

13. The light emitting display device of claim 12, wherein in the blue pixel region, a bottom end line of the reflective portion coincides with a side end line of the second lens, and side ends of some of the first lenses located in a region where the side end line of the second lens passes coincide with the side end line of the second lens.

14. The light emitting display device of claim 10, wherein the first capping layer is disposed on the light emitting diode and the bank, and a top surface of the first capping layer has a uniform height.

15. The light emitting display device of claim 10, wherein the first capping layer is disposed on the light emitting diode and the bank, and wherein a height of the first capping layer located on the bank is higher than that of the first capping layer located on the light emitting diode.

16. The light emitting display device of claim 10, wherein the first capping layer is formed in the opening, and a height of the first capping layer is lower or higher than a top surface of the bank.

17. The light emitting display device of claim 10, wherein the first capping layer is formed of a self-crystallization material.

18. The light emitting display device of claim 10, wherein the first lens is surrounded by six first lenses therearound.

19. The light emitting display device of claim 10, wherein the light emitting diode includes a first electrode, a light emitting layer on the first electrode, and a second electrode on the light emitting layer, and wherein the reflective portion extends from the first electrode of the light emitting diode.

20. The light emitting display device of claim 10, further comprising an encapsulation film disposed between the first and second capping layer, and the second lens.

* * * * *